(12) United States Patent
Bois et al.

(10) Patent No.: US 7,741,594 B2
(45) Date of Patent: Jun. 22, 2010

(54) ELECTROMAGNETIC WAVE DETECTOR WITH AN OPTICAL COUPLING SURFACE COMPRISING LAMELLAR PATTERNS

(75) Inventors: Philippe Bois, Cesson (FR); Eric Costard, Massy (FR); Alfredo De Rossi, Paris (FR); Alexandru Nedelcu, Montrouge (FR)

(73) Assignee: Thales (FR)

( * ) Notice: Subject to any disclaimer, the term of this patent is extended or adjusted under 35 U.S.C. 154(b) by 386 days.

(21) Appl. No.: 10/558,187

(22) PCT Filed: May 26, 2004

(86) PCT No.: PCT/EP2004/050932

§ 371 (c)(1),
(2), (4) Date: Nov. 25, 2005

(87) PCT Pub. No.: WO2004/107455

PCT Pub. Date: Dec. 9, 2004

(65) Prior Publication Data
US 2006/0289728 A1 Dec. 28, 2006

(30) Foreign Application Priority Data
May 27, 2003 (FR) ................... 03 06432

(51) Int. Cl.
*H01L 31/00* (2006.01)
(52) U.S. Cl. ............ 250/214.1; 250/216; 257/21; 257/431; 257/432; 257/441; 257/442
(58) Field of Classification Search .......... 250/214.1, 250/216; 257/21, 431, 432, 441, 442
See application file for complete search history.

(56) References Cited
U.S. PATENT DOCUMENTS
5,086,327 A 2/1992 Rosencher et al.

(Continued)

FOREIGN PATENT DOCUMENTS
EP 0 866 504 A 9/1998

OTHER PUBLICATIONS

Beck W et al: Proceedings of the fifth international symposium on long wavelength infrared detectors and arrays; physics and applications; Paris, France Aug. 31, 1997, pp. 48-62.

(Continued)

*Primary Examiner*—Mary Wilczewski
*Assistant Examiner*—Telly D Green
(74) *Attorney, Agent, or Firm*—Lowe Hauptman Ham & Berner, LLP

(57) ABSTRACT

The invention relates to a detector comprising a multiple quantum well structure operating on interband or intersubband transitions by absorption of radiation having a wavelength λ having a polarization comprising a component perpendicular to the plane of the multiple quantum well structure, and comprising optical coupling means for coupling said radiation, wherein the coupling means comprise a set of first diffractive lamellar features that are distributed along at least a first direction and a set of second diffractive lamellar features that are distributed along at least a second direction, said first and second directions being mutually perpendicular and lying in a plane parallel to the plane of the multiple quantum well structure.

17 Claims, 5 Drawing Sheets

U.S. PATENT DOCUMENTS

| | | |
|---|---|---|
| 5,187,715 A | 2/1993 | Weisbuch et al. |
| 5,228,777 A | 7/1993 | Rosencher et al. |
| 5,326,984 A | 7/1994 | Rosencher et al. |
| 5,506,418 A | 4/1996 | Bols et al. |
| 5,539,206 A * | 7/1996 | Schimert ................. 250/338.4 |
| 5,677,544 A | 10/1997 | Duboz et al. |
| 5,712,499 A | 1/1998 | Duboz et al. |
| 5,719,670 A | 2/1998 | Duboz et al. |
| 5,726,500 A | 3/1998 | Duboz et al. |
| 5,773,831 A * | 6/1998 | Brouns ................. 250/370.08 |
| 5,869,844 A | 2/1999 | Rosencher et al. |
| 6,091,126 A | 7/2000 | Costard et al. |
| 6,157,020 A | 12/2000 | Krapf et al. |
| 6,180,990 B1 * | 1/2001 | Claiborne et al. .......... 257/440 |
| 6,452,187 B1 * | 9/2002 | Claiborne et al. ...... 250/370.12 |
| 6,521,894 B1 * | 2/2003 | Iwanczyk et al. ...... 250/370.11 |
| 6,521,967 B1 * | 2/2003 | Bandara et al. ............. 257/440 |
| 6,534,758 B2 * | 3/2003 | Costard et al. ........... 250/208.1 |
| 6,627,868 B2 * | 9/2003 | Bois et al. ................ 250/214.1 |
| 6,797,938 B2 * | 9/2004 | Bois et al. ................... 250/225 |
| 6,809,350 B1 | 10/2004 | Berger et al. |
| 6,828,642 B2 * | 12/2004 | Claiborne et al. ........... 257/440 |
| 6,920,290 B2 * | 7/2005 | Mitra ........................ 398/207 |
| 7,135,698 B2 * | 11/2006 | Mitra ........................... 257/21 |
| 2003/0136909 A1 * | 7/2003 | Plante .................... 250/338.4 |
| 2006/0243892 A1 * | 11/2006 | Bois et al. ................... 250/225 |

OTHER PUBLICATIONS

Beekman D W et al: "Polarization sensitive OWIP thermal imager" QWIP 2000 Workshop on Quantum well Infrared Photodetectors, Dana Point, CA Jul. 27-29, 2000 pp. 323-238.

Cardimona D A et al: "Investigation of a concentric-ring grating coupler for normal-incidence absorption in quantum-well infrared photodetectors" Extended Abstracts, Electrochemical Society Princeton, NJ p. 217.

Chen E et al: "A Novel Device for Detecting the polarization direction of linear polarized light using integrated subwavelength gratings and photodectors" IEEE Photonics Technology Letters, IEEE NY, USA Sep. 1, 1997 pp. 1259-1261.

Goossen, K. W. and S. A. Lyon, "Grating Enhanced Quantum Well Detector", Princeton University, Department of Electrical Engineering, Princeton, New Jersey 08544, Appl. Phys. Lett. 47 (12), Dec. 15, 1985, pp. 1257-1259.

Petit, R. "Electromagnetic Theory of Gratings", Springer (Dec. 1980)( Book).

* cited by examiner

ELECTROMAGNETIC WAVE DETECTOR WITH AN OPTICAL COUPLING SURFACE COMPRISING LAMELLAR PATTERNS

FIELD OF THE INVENTION

The field of the invention is that of electromagnetic wave detectors made of semiconductor material and especially one having a multiple quantum well structure, particularly one suitable for the infrared range.

BACKGROUND OF THE INVENTION

The rapid advances made in epitaxial growth on GaAs-type substrates has led to the development of a new class of electromagnetic wave detectors using the absorption of radiation around a wavelength $\lambda$ corresponding to the electron transition between various energy levels within one and the same band or between the valence band and the conduction band. The diagram shown in FIG. 1 illustrates this type of transition.

The recent evolution in performance of this type of component is due in particular to the relatively easy production of semiconductor heterojunction multilayers in the standard system by MBE (molecular beam epitaxy), that is to say the GaAs/Ga$_{(1-x)}$Al$_x$As. By adjusting the growth parameters, the thickness of the quantum wells and the percentage x of aluminum in the barriers imposing the confinement potential, it is possible to choose a narrow detection band (about 1 micron) centered on a given wavelength.

This type of structure has the advantage of providing very good sensitivity because of the discretization of the energy levels within the conduction bands of the photoconductor materials used.

Within the context of intersubband transitions, so that this type of transition is possible, it is necessary for the electric field of the incident electromagnetic wave to have a component along the direction of growth of the layers, i.e. along the direction D indicated in FIG. 1, this direction being perpendicular to the plane of the layers. The consequence of this physical effect is that a detector has little or no absorption in the case of illumination at normal incidence.

It has already been proposed to use coupling means of the diffraction grating type (cf. Goossen and Lyon, APL 47 (1985), pp 1257-1259) for generating said perpendicular component, creating diffracted rays, especially lamellar (1D) gratings or steps for coupling only a single polarization of the light. However, crossed diffraction gratings are also known for coupling the various electric field components of incident radiation, as illustrated in FIG. 2. The matrix grating Rij diffracts the incident radiation along both the direction Dx and the direction Dy. The major drawback of this type of matrix structure lies in the depth d for diffractive features that are generally produced within an encapsulation layer EL, thereby protecting the multiple quantum well MQW structure as illustrated in FIG. 3.

SUMMARY OF THE INVENTION

To solve this problem, the present invention proposes to use lamellar features with a feature architecture that nevertheless allows incident radiation to be diffracted in the various directions in a plane parallel to the plane of the multiple quantum well structure.

More precisely, the subject of the present invention is a detector comprising a multiple quantum well structure operating on interband or intersubband transitions by absorption of radiation having a wavelength $\lambda$ and comprising optical coupling means for coupling said radiation, wherein the coupling means comprise a set of first diffractive lamellar features that are distributed along at least a first direction and a set of second diffractive lamellar features that are distributed along at least a second direction, said first and second directions being mutually perpendicular and lying in a plane parallel to the plane of the multiple quantum well structure.

In general, the object of the invention is to increase the electromagnetic field in the form of optical modes within the active layer and the invention can therefore be applied to intersubband transitions or to interband transitions.

Advantageously, the detector may comprise first features having areas having dimensions equivalent to the dimensions of the areas of the second lamellar features.

According to one embodiment of the invention, the first lamellar features and the second lamellar features are distributed so as to form concentric squares or rectangles.

According to a second embodiment of the invention, the first lamellar features and the second lamellar features are distributed about a center of symmetry with a distribution in the form of four quadrants.

According to a third embodiment of the invention, the first features and the second features are distributed radially along first and second mutually perpendicular directions.

Advantageously, the detector according to the invention may comprise a multilayer stack produced on the surface of a substrate, said stack comprising the multiple quantum well structure and external layers, the lamellar features being etched within one external layer.

According to one embodiment of the invention, the multilayer stack is a stack of layers of the doped GaAs or GaAlAs type, the substrate being of the undoped GaAs type.

According to one embodiment of the invention, the multiple quantum well structure is made up of an alternation of doped GaAs layers and doped GaAlAs layers, the external layers being ohmic contact layers based on GaAs more highly doped than the constituent layers of the multiple quantum well structure.

According to one embodiment of the invention, the detector comprises a substrate that is transparent at the wavelength of the incident radiation and a layer that is reflective at said wavelength, said reflective layer being on the surface of the lamellar features so as to make the detector operate in reflection.

Advantageously, the etch depth may be around $\lambda/4$ instead of $\lambda/2$, according to the grating theory known by those skilled in the art and described for example in "*Electromagnetic Theory of Gratings*" by R. Petit, which shows that the etch depth in the case of a crossed (2D) grating must be twice that of a simple lamellar (1D) grating. From an industrial standpoint, reducing the thickness of the layers to be etched will allow the fabrication time and the fabrication costs to be reduced but will also increase the production.

The subject of the invention is also a matrix detector characterized in that it comprises a matrix of individual detector elements, each individual detector element having a multilayer stack, said stack comprising the multiple quantum well structure and external layers, the first and second lamellar features being etched within one external layer, said individual detector elements being produced on the surface of a common substrate.

BRIEF DESCRIPTION OF THE DRAWINGS

The invention will be more clearly understood and other advantages will appear on reading the description that follows and thanks to the appended figures among which.

In general, the detector according to the invention comprises lamellar features along two mutually orthogonal directions and lying within a plane parallel to the plane of the constituent layers of the multiple quantum well structure. For symmetry reasons, it is preferable for the first total area corresponding to all of the surfaces of the first lamellar features along a first direction to be equal to the second total area corresponding to all of the surfaces of the second lamellar features.

DESCRIPTION OF THE INVENTION EMBODIMENT

Figure 4:
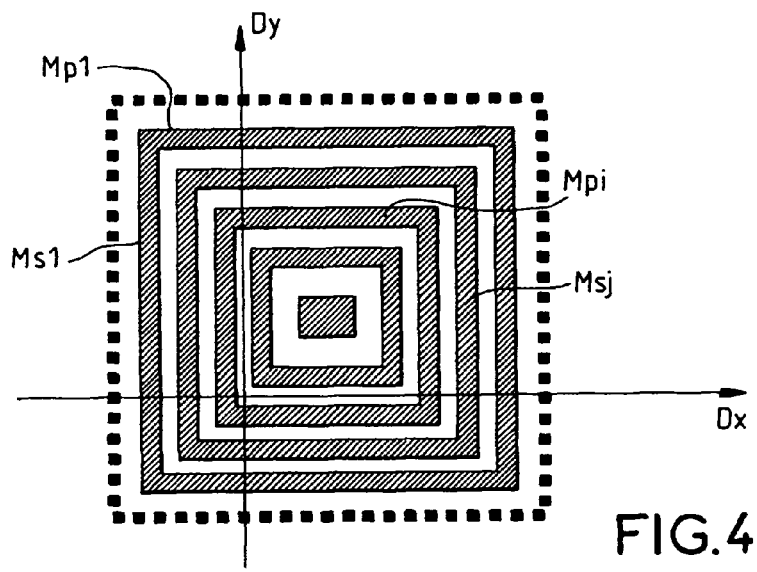
FIG. 4 illustrates an optical coupling structure used in a first embodiment of a detector according to the invention, in which structure the lamellar features are distributed concentrically.

According to a first embodiment of the invention, the lamellar features are distributed concentrically as illustrated in FIG. 4, the bold lines representing the etched features.

Thus, the first lamellar features Mfi are arranged along a first direction Dx with a grating spacing P that depends on the wavelength λ and on the mean index n of the multiple quantum well structure (P=λ/n) and the second lamellar features Msj are arranged along a second direction Dy, perpendicular to the direction Dx, with the same grating spacing P. According to this embodiment of the invention, there are pairs of first features and of second features having the same dimensions, which form concentric squares. More precisely, as shown in FIG. 4, the feature Mf1 has the same dimensions as the feature Ms1. In this configuration, there is a series of first lamellar features having variable dimensions and a series of second lamellar features also having variable dimensions, the total area of the first features being equal to the area of all of the second lamellar features.

Figure 1:
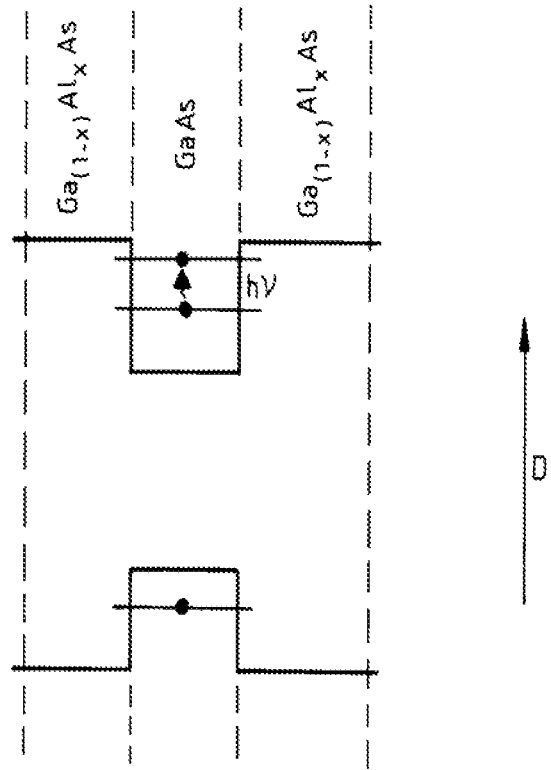
FIG. 1 illustrates a multiple quantum well structure according to the known art.
Figure 2:
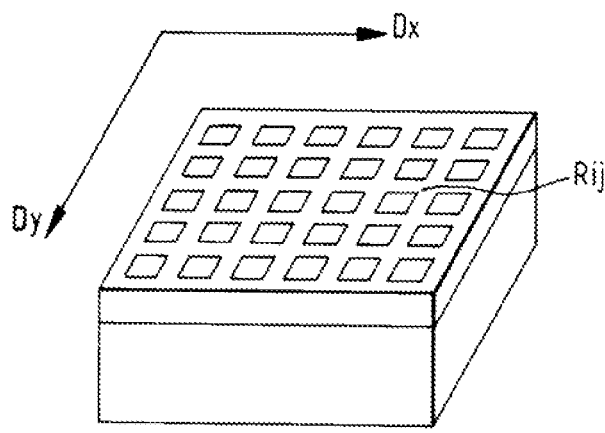
FIG. 2 illustrates a multiple quantum well detector possessing optical coupling means of the matrix diffraction grating type according to the prior art.
Figure 3:
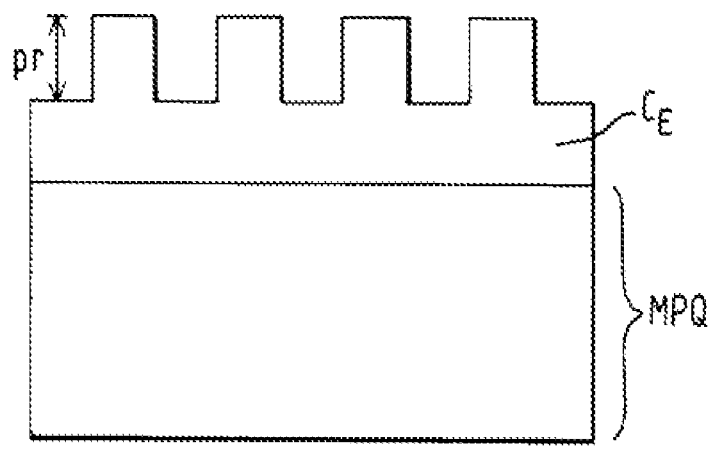
FIG. 3 illustrates a cross-sectional view of a multiple quantum well detector in which the matrix diffraction grating is produced within an encapsulation layer, according to the prior art.
Figure 5:
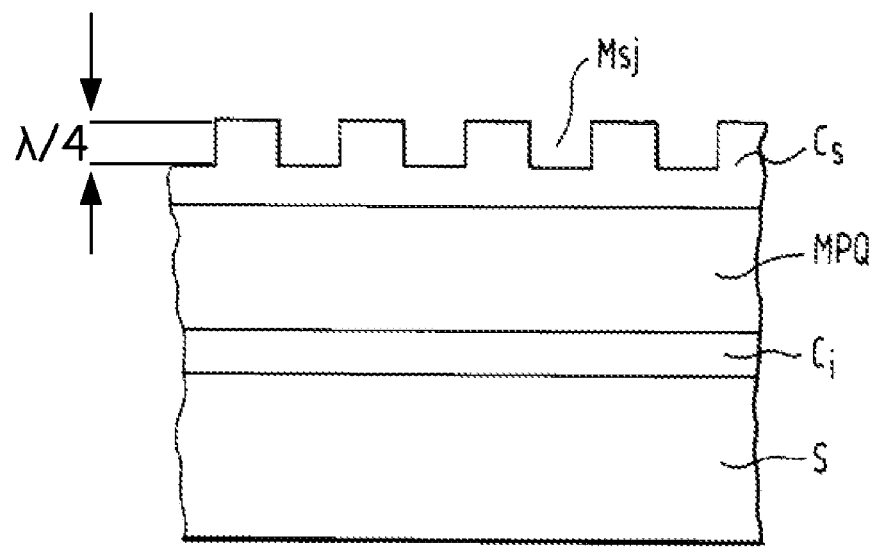
FIG. 5 illustrates a cross-sectional view of the detector illustrated in FIG. 4.

To produce this coupling architecture, the detector according to the invention may be conventionally produced on the surface of a substrate S made of semiconductor material. An assembly of layers constituting an ohmic contact called the lower contact $C_1$ made of highly doped semiconductor material is deposited on the surface of the substrate. This ohmic contact supports the set of semiconductor layers constituting the multiple quantum well structure MQW, this structure being in contact with an assembly of layers constituting an ohmic contact called the upper contact $C_u$, the detection taking place between the two ohmic contacts. Advantageously, the lamellar features may be etched in the ohmic contact layer as illustrated in FIG. 5, which shows a cross-sectional view in a plane perpendicular to the direction Dy of the second lamellar features Msj.

Figure 6:
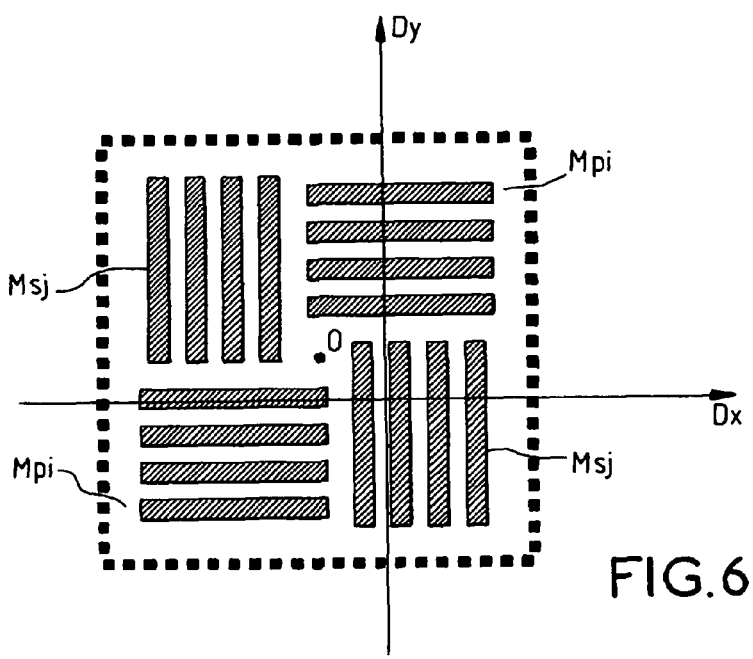
FIG. 6 illustrates an optical coupling structure used in a second embodiment of a detector according to the invention, in which structure the lamellar features are distributed in four quadrants.

In a second embodiment of the invention, the lamellar features may be distributed as illustrated in FIG. 6 so as to maintain equivalent properties in terms of optical coupling along all the directions lying within a plane parallel to the plane of the multiple quantum well structure and to obtain equivalent diffractive areas for the first lamellar features and the second lamellar features, the first features and the second features being arranged in four quadrants and about a center of symmetry O.

Figure 7:
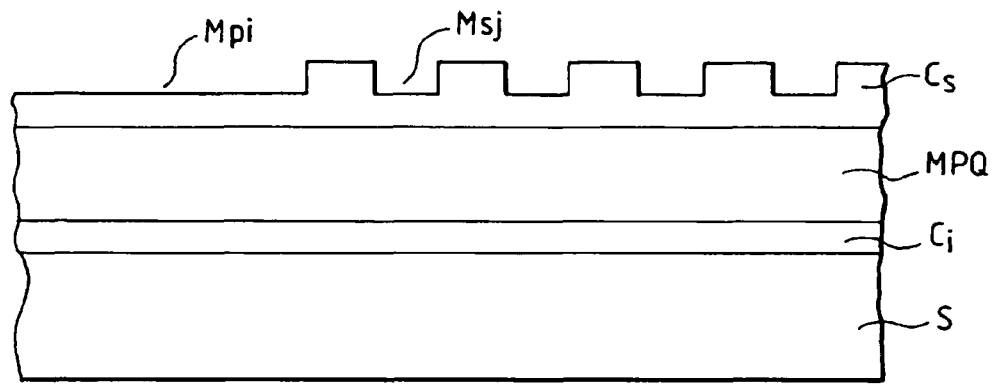
FIG. 7 illustrates a cross-sectional view of the detector illustrated in FIG. 6.

In the same way as in the first embodiment of the invention, the detector according to this second embodiment may be produced on the surface of a semiconductor substrate, by stacking semiconductor layers in order to form the set of contact layers and the set of layers constituting the multiple quantum well structure. The lamellar features may be produced within the upper contact layer $C_u$. FIG. 7 illustrates a cross-sectional view in a plane perpendicular to the direction Dy.

Figure 8:
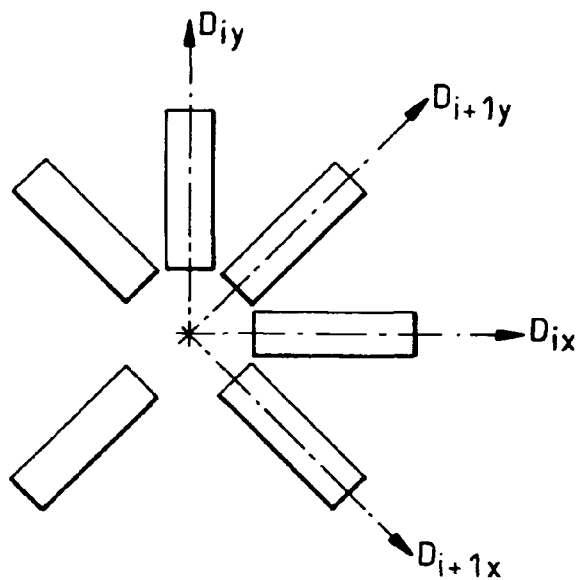
FIG. 8 illustrates an optical coupling structure in which the lamellar features are distributed radially.

In a third embodiment of the invention, the lamellar features may be distributed radially, as illustrated in FIG. 8. In this configuration, the first features are arranged along first directions Dix, Di+1x, and the second features are distributed along second directions Diy, Di+1y, the directions Dix, Di+1x and Diy, Di+1y being mutually perpendicular.

The above description has shown optical coupling configurations for an elementary detector that may be advantageously applied within the context of a matrix detector comprising individual elements, each of these individual elements having, on the surface, optical coupling means comprising diffractive lamellar features along the directions Dx and Dy.

Figure 9:
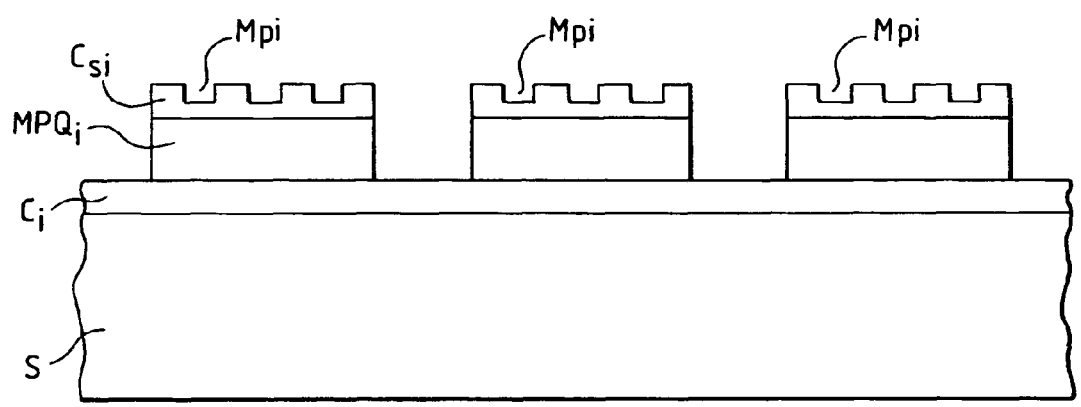
FIG. 9 illustrates an example of a matrix detector according to the invention.

FIG. 9 illustrates an example of a matrix detector according to the invention in which all of the individual detectors are produced on the surface of a common substrate with an ohmic contact layer that is also common.

To produce this architecture, the procedure is as follows:
a first ohmic contact layer $C_1$ is produced on a substrate that is transparent to the wavelengths at which the detector is sensitive, said contact layer $C_1$ also being transparent;
a multilayer stack constituting the multiple quantum well structure is produced on this ohmic contact layer;
the second ohmic contact layer $C_u$ is deposited;
the lamellar features are etched in the layer $C_u$;
the individual detection elements are defined by etching all of the layers down to the surface of the lower contact layer $C_1$; and
advantageously, an encapsulation layer may be deposited on the matrix detector thus obtained.

Embodiment Example

We will now describe an example of a detector according to the invention that operates in the infrared range, and more particularly one suitable for the 8-12 micron range.

The lower ohmic contact layer made of Si-doped GaAs with a doping content of $5 \times 10^{18}$ cm$^{-3}$ and a thickness of typically 2 microns is deposited on an intrinsically undoped GaAs substrate.

The multiple quantum well structure is produced by the stacking of 50 wells composed of an Si-doped GaAs layer with a charge carrier concentration of $5 \times 10^{18}$ cm$^{-3}$ with a thickness of 5 nm, this being inserted between two barrier layers consisting of $Ga_{0.75}Al_{0.25}As$ with a thickness of 50 nm.

The upper contact layer is identical to the lower contact layer and also has a thickness of 2 microns.

The lamellar features are produced within this upper contact layer.

To obtain the desired diffracting effects at an operating wavelength around 9 microns, the etch depths are 0.7 microns and the spacing of the features is 2.7 microns (the mean index of the structure being from 3.3 to 9 microns). The fill factor of the surface of the upper contact layer is typically around 50%.

The invention claimed is:

1. A detector comprising: a multiple quantum well structure operating on interband or intersubband transitions by absorption of radiation having a wavelength $\lambda$ each quantum well structure comprising: optical coupling means for coupling said radiation, wherein the coupling means comprise a set of first elongate, narrow diffractive lamellar features that are distributed along at least a first direction and a set of second elongate, narrow diffractive lamellar features that are distributed along at least a second direction, said first and second directions being mutually perpendicular and lying in a plane parallel to the plane of the multiple quantum well structure; wherein the first lamellar features and the second lamellar features are distributed so as to form concentric rectangles or squares, the electromagnetic wave detector comprising a multilayer stack produced on a surface of a substrate, said stack comprising the multiple quantum well structure and external layers, the lamellar features being etched within one external layer.

2. The electromagnetic wave detector as claimed in claim 1, wherein the first lamellar features and the second lamellar features have areas of similar dimensions.

3. The electromagnetic wave detector as claimed in claim 1, wherein the first lamellar features and the second lamellar features are distributed about a center of symmetry with a distribution in the form of four quadrants.

4. The electromagnetic wave detector as claimed in claim 1, wherein the etch depth of the lamellar features is around $\lambda/4$.

5. The electromagnetic wave detector as claimed in claim 1, wherein the multilayer stack is a stack of layers of the doped GaAs or GaAlAs type, the substrate being of the undoped GaAs type.

6. The electromagnetic wave detector as claimed in claim 5, wherein the multiple quantum well structure is made up of an alternation of doped GaAs layers and doped GaAlAs layers, the external layers being ohmic contact layers based on GaAs more highly doped than the constituent layers of the multiple quantum well structure.

7. The electromagnetic wave detector as claimed in claim 1, wherein it comprises a substrate that is transparent at the wavelength of the incident radiation and a layer that is reflective at said wavelength, said reflective layer being on the surface of the lamellar features so as to make the detector operate in reflection.

8. A matrix detector comprising a matrix of individual detector elements as claimed in claim 1, each individual detector element having a multilayer stack, said stack comprising the multiple quantum well structure and external layers, the lamellar features being etched within one external layer, said individual detector elements being produced on the surface of a common substrate.

9. The electromagnetic wave detector as claimed in claim 2, wherein the first lamellar features and the second lamellar features are distributed about a center of symmetry with a distribution in the form of four quadrants.

10. The electromagnetic wave detector as claimed in claim 2, comprising a multilayer stack produced on the surface of a substrate, said stack comprising the multiple quantum well structure and external layers, the lamellar features being etched within one external layer.

11. The electromagnetic wave detector as claimed in claim 1, comprising a multilayer stack produced on the surface of a substrate, said stack comprising the multiple quantum well structure and external layers, the lamellar features being etched within one external layer.

12. The electromagnetic wave detector as claimed in claim 3, comprising a multilayer stack produced on the surface of a substrate, said stack comprising the multiple quantum well structure and external layers, the lamellar features being etched within one external layer.

13. The electromagnetic wave detector as claimed in claim 4, wherein the multilayer stack is a stack of layers of the doped GaAs or GaAlAs type, the substrate being of the undoped GaAs type.

14. The electromagnetic wave detector as claimed in claim 4, wherein it comprises a substrate that is transparent at the wavelength of the incident radiation and a layer that is reflective at said wavelength, said reflective layer being on the surface of the lamellar features so as to make the detector operate in reflection.

15. The electromagnetic wave detector as claimed in claim 5, wherein it comprises a substrate that is transparent at the wavelength of the incident radiation and a layer that is reflective at said wavelength, said reflective layer being on the surface of the lamellar features so as to make the detector operate in reflection.

16. The electromagnetic wave detector as claimed in claim 6, wherein it comprises a substrate that is transparent at the wavelength of the incident radiation and a layer that is reflective at said wavelength, said reflective layer being on the surface of the lamellar features so as to make the detector operate in reflection.

17. A detector comprising a multiple quantum well structure operating on interband or intersubband transitions by absorption of radiation having a wavelength $\lambda$ and comprising optical coupling means for coupling said radiation, wherein the coupling means comprise a set of first diffractive lamellar features that are distributed along at least a first direction and a set of second diffractive lamellar features that are distributed along at least a second direction, said first and second directions being mutually perpendicular and lying in a plane parallel to the plane of the multiple quantum well structure; wherein the first lamellar features and the second lamellar features are contiguous so to form spaced concentric rectangular or square annuli.

* * * * *